United States Patent [19]

Petit

[11] Patent Number: 4,670,667

[45] Date of Patent: Jun. 2, 1987

[54] SERIES-CONNECTED POWER TRANSISTORS

[75] Inventor: Jean P. Petit, Paris, France

[73] Assignee: Jeumont-Schneider Corporation, Puteaux, France

[21] Appl. No.: 693,264

[22] Filed: Jan. 22, 1985

[30] Foreign Application Priority Data

Jan. 25, 1984 [FR] France ................ 84 01152

[51] Int. Cl.⁴ .............. H03K 17/56; H03K 3/14; H03K 5/00
[52] U.S. Cl. .................... 307/254; 307/314; 307/262
[58] Field of Search .......... 307/254, 314, 282; 330/276, 262

[56] References Cited

U.S. PATENT DOCUMENTS

| 2,998,487 | 8/1961 | Hilbourne | 307/254 |
| 3,235,753 | 2/1966 | Gaunt, Jr. | 307/254 |
| 3,239,772 | 3/1966 | Dennis, Jr. | 330/262 |
| 3,710,147 | 1/1973 | Lee | 307/254 |
| 4,275,360 | 6/1981 | Gill et al. | 330/276 |

FOREIGN PATENT DOCUMENTS 917382  2/1963  United Kingdom .
1236212 6/1971  United Kingdom .

Primary Examiner—Stanley D. Miller
Assistant Examiner—Trong Quang Phan
Attorney, Agent, or Firm—Rines and Rines Shapiro and Shapiro

[57] ABSTRACT

A balancing circuit (2) comprising two windings (L1) and (L2) detects a current (Ids) between the common collector-to-emitter junction of two power transistors in series and the common junction of two balancing capacitors connected across the transistors in order to balance the collector-to-emitter voltages (VCE) of the transistors.

7 Claims, 5 Drawing Figures

SERIES-CONNECTED POWER TRANSISTORS

This invention relates to the connecting of at least two power transistors in series.

The progress accomplished in power-transistor technology provides a useable commutator component in the fields of power electronics and electrical systems requiring large voltages and currents.

Thus, today there are high-current power transistors (several tens of amperes) of small gain and high VCEO voltage (collector-to-emitter voltage of the transistor with base-open circuit or Ib=0 base current) on the order of 800 volts, and thereby having large stored charges.

However, electrical system requirements, in particular, often emcompass higher voltages, hence the interest in providing series-connected power transistors.

Systems incorporating at least two power transistors in series require a VCE voltage balancing that is as perfect as possible (VCE denoting the collector-to-emitter voltage of the transistors).

In steady state operation with at least two transistors in series, the balancing problem is easily resolved by using two series-connected resistances switched in parallel between the collector of one of the transistors and the emitter of the other transistor in such a manner as to form a balancing resistance bridge.

In the dynamic state of operation and particularly at the training on of the series-connected transistors, the time dispersions or time during which the rise of the collector currents oocur, while the VCE remins equal to the supply voltage, are on the order of a microsecond. The balacing can then be resolved with capacitors of a few microfarads.

At the blocking commutations or turn-off, the high-voltage, high-current and hence small-gain transistors have stored charges in the collector-base junction that are very large and often very different from one transistor to the other. The reblocking time which is spread over tens of microseconds requires the use of high-capacity balancing capacitors.

However, the cost and size of the high-capacity capacitors greatly inhibit the practicality of providing series-connected power transistors.

An object of the present invention is to remedy the above-described disadvantage by proposing a simple and efficient balancing circuit for the transistors.

In summary, the invention relates to apparatus having at least two power transistors in series, each controlled at its base by a control device and having an associated dynamic balancing capacitor, the capacitors being arranged in series with their common junction connected to the collector-to-emitter junction of the two series-connected transistors through a connection traversed by a current during the change of state of the two series-connected transistors, characterized in that the apparatus includes a balancing circuit comprising current-sensitive components and balancing signal generating components acting on the control devices in order to increase the base current of one of the transistors and to reduce the base current of the other transistors as a function of the magnitude and the direction of the current in the aforementioned connection, so as to nullify this current flowing through the connection.

According to another characteristic of the invention, the current-sensitive components and the generating components of the balancing circuit may consist of two series windings, each connected inductively to the control device.

Still according to another advantageous characteristic of the invention, each winding of the balancing circuit may be connected inductively to a secondary winding of a control transformer galvanically isolating each power transistor from a common generator of control signals.

The invention will be best understood and other purposes, characteristics, details and advantages will appear more clearly during the following explanatory description prepared in reference to the attached diagrammatic drawings which are included solely to illustrate a method of applying the invention and in which:

FIG. 1 shows a series circuit of two power transistors T1 and T2, the emitter of the transistors T1 being connected to the collector of the transistor T2.

A load C, for example an inductive load, is connected on the one hand by one of its terminals to the negative voltage −E of a power-supply voltage and on the other hand by its other terminal to the emitter of the power transistor T2, the collector of the power transistor T1 being connected to the positive voltage +E of the supply voltage. Of course, the load C, instead of being connected to the emitter circuit of the transistor T2, can be connected to the collector circuit of the transistor T1.

Figure 1:
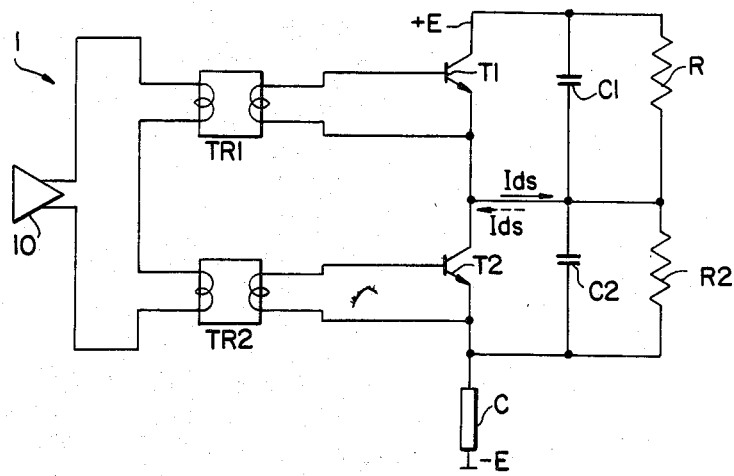
FIG. 1 represents a series circuit of two power transistors to which the present invention is applied.

Each power transistor T1 and T2 is controlled at its base by a control circuit 1 comprising a generator of the appropriate control signals 10 and two control transformers TR1 and TR2 galvanically isolating the power transistors T1 and T2, respectively, from the control-signal generator 10. Thus, as can be seen in FIG. 1, the primary windings of the control transformers TR1 and TR2 are connected in series, their end terminals being connected to the output of the generator 10. The secondary winding of the control tranformer TR1 is connected between the base and the emitter of the power transistor T1, whereas the secondary winding of the control transformer TR2 is connected between the base and the emitter of the power transistor T2. The galvanic isolation between a control-signal generating circuit and the power stage constituted by two power transistors is already known in itself, and therefore need not be the subject of a more detailed description.

Two series-connected resistances R1 and R2 are placed between the collector of the transistor T1 and the emitter of the transistor T2 and have their common junction connected to the collector-to-emitter common junction of the transistors T1 and T2. These two resistances form, as it were, a balancing bridge for the VCE voltages in static or steady state operation of the transistors T1 and T2 as is already known.

Two capacitors C1 and C2 connected in series between the collector of the transistor T1 and the emitter of the transistor T2 also have their common junction connected to the common junction of the transistors T1 and T2; these two capacitors provide voltage balancing in dynamic operational states of these transistors.

With each of the power transistors T1 and T2 having a VCEO (collector-to-emitter voltage, base open) presently on the order of 800 volts, it will be appreciated that the transistors T1 and T2 placed in series can sustain a high supply voltage during their blocking mode (i.e., while turned off). Thus the load C has a high voltage at its terminals and is traversed by a high current during the conduction of these transistors, and this while having a satisfactory balance in both static and dynamic states.

However, in order to avoid the use of high-capacity capacitors during the blocking commutations of the transistors T1 and T2, the invention provides simple and efficient balancing means now to be described.

As a matter of fact, during an unbalancing in VCE voltages, during the change of state of the transistors T1 and T2, a current designated Ids, flows through the connection between the collector-to-emitter common junction of the two transistors and the common junction of the capacitors C1 and C2. The direction and the amplitude of this current Ids depends upon the relative values of the voltages $VCE_1$ and $VCE_2$ of the transistors T1 and T2. Thus, the current Ids has the direction indicated by the solid line arrow shown in FIG. 1 when $VCE_2$ varies much more than $VCE_1$ in time, that is, when the derivative of $VCE_2$ with respect to time is greater than the derivative of $VCE_1$ with respect to time, or:

$$\frac{dVCE_2}{dt} > \frac{dVCE_1}{dt}$$

The direction of Ids will be that indicated in dashed lines on FIG. 1 when:

$$\frac{dVCE_2}{dt} < \frac{dVCE_1}{dt}$$

According to the present invention, the purpose of the circuit is to measure the direction and the amplitude of the Ids current and to act on the base currents of the transistors in order to rebalance the voltages VCE of the transistors by adjusting their gain (B).

Figure 2:
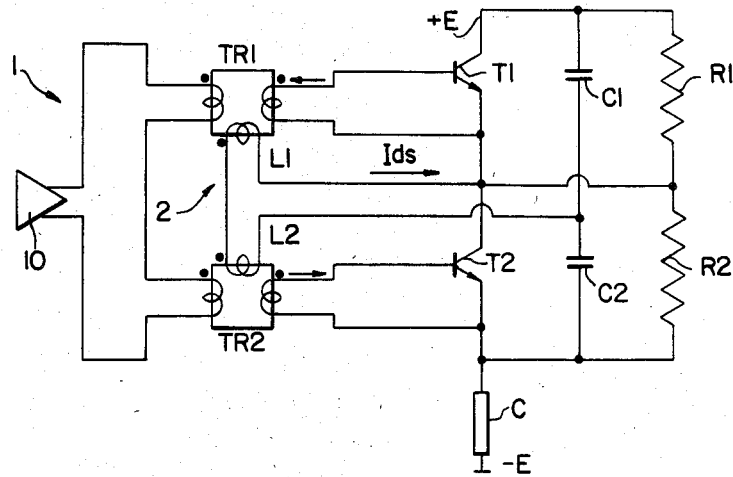
FIG. 2 illustrates the series circuit of two power transistors comprising the balancing circuit according to the invention.

Such a circuit is shown in the diagram of FIG. 2, where the components common with those of FIG. 1 bear the same references.

As shown in FIG. 2, the balancing circuit 2 of the power transistors T1 and T2 comprises two windings L1 and L2 arranged in series, the end terminals of these windings being connected between the common junction of the transistors T1 and T2 and the common junction of the capacitors C1 and C2.

The L1 winding actually forms a supplementary winding of the control transformer TR1 inductively connected to the secondary winding of this transformer, whereas the winding L2 is a supplementary winding of the control transformer TR2 inductively connected to the secondary winding of the latter. Thus, this balancing circuit is capable of detecting a current Ids flowing through the windings L1 and L2 and of generating balancing signals in the secondary windings of the control transformers acting on the base currents of the transistors T1 and T2 in order to balance the VCE voltages, the balance being reached when Ids=0.

Figure 3A:
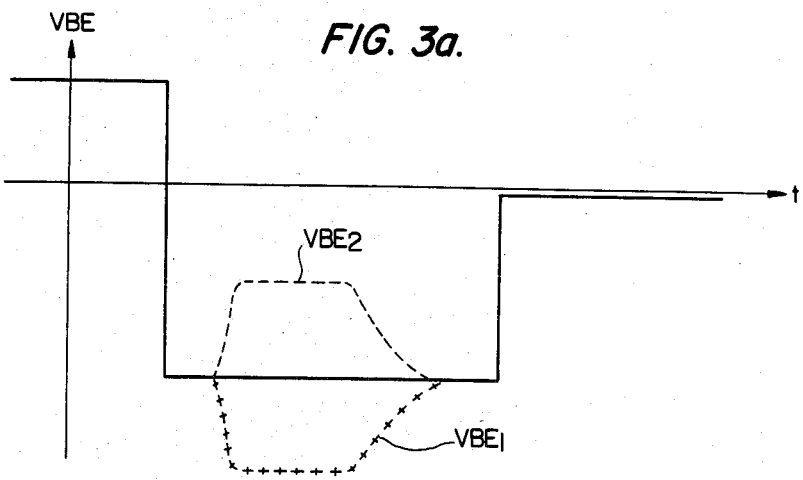
FIGS. 3a, 3b and 3c show the various voltage and current curves obtained by the balancing of the transistors during their blocking commutation (turn-off).
Figure 3B:
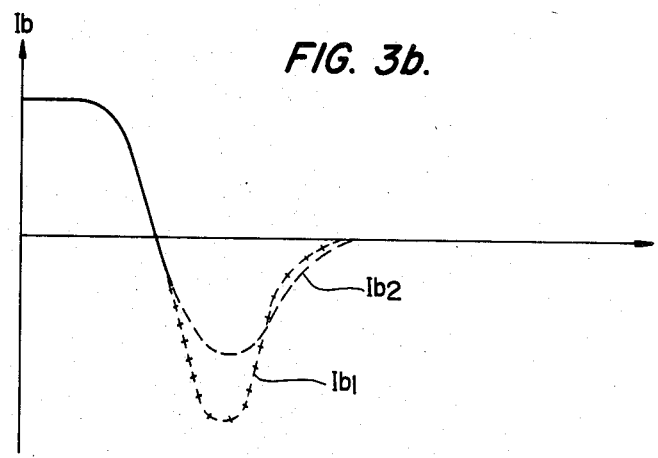
Figure 3C:
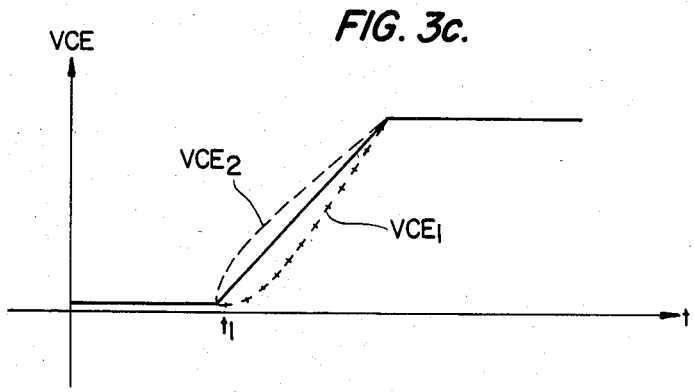

As an example, the functioning of the balancing circuit of the transistors is going to be described during the blocking commutations of these transistors by referring to FIGS. 3a through 3c.

FIG. 3b shows the base current Ib as a function of time applied to the input of the power transistors T1 and T2. During the blocking commutation of the transistors, the current Ib decreases by its value corresponding to the conduction of the transistors to reach a negitive value necessary for the reduction of the blocking time of the transistors, the voltage VBE of the transistors then becomes negative as shown in heavy lines on FIG. 3a.

Several instants after Ib=0 (that is, when the transistors T1 and T2 are no longer conductors), the VCE voltages begin to increase until reaching the blocking voltage of the transistors as shown on FIG. 3c.

However, at this instant t1 where the VCE voltages begin to increase, an unbalancing of these voltages can be created in the case where, for example:

$$\frac{dVCE_2}{dt} > \frac{dVCE_1}{dt}$$

which results in an unbalanced current Ids having the direction indicated on FIG. 2. The current flowing through the windings L1 and L2 induces in the windings of the transformers TR1 and TR2, currents whose directions are indicated by the heavy-line arrows and whose amplitude is dependent upon that of the current Ids. The current flowing through the secondary winding of the transformer TR1 is going to make the current Ib1 more negative and hence greater, whereas the current flowing through the secondary winding of the transformer TR2 is going to make the current Ib2 of T2 less negative and hence lesser, as shown on FIG. 3b.

The passage of these balancing currents through the secondary windings of the transformers is therefore going to modify the voltages VBE1 and VBE2, as shown in FIG. 3a. This action on the voltages VBE1 and VBE2 of the transistors T1 and T2 permits re-establishing the balance of the VCE voltages of these transistors, these VCE voltages varying from the same quantity with respect to time while preserving the balance of the transistors. The current Ids will then be null at the balance. Any unbalancing is therefore detected by the balancing circuit during the blocking commutation of the transistors until the VCE voltages reach the blocking voltage.

The above description concerning the manner in which the current Ids acts on the voltages was made in reference to the blocking commutations of the transistors, but it is very obvious that the current acts equally on the balancing circuit during the saturation commutations of the transistors.

Of course, the use of the balancing circuit, according to the invention, can be extended to several transistors, the balancing of these transistors always being accomplished two by two.

Lastly, other means for the balancing circuit can be used without departing from the framework of the present invention provided that this balancing circuit comprises means for detecting a current between the collector-to-emitter common junction of the power transistors and the common junction of the capacitors, and means for generating balancing signals in response to such current, so as to re-establish the balance of the transistors.

The present invention has therefore provided a balancing circuit that is simple, efficient, easy to construct and of low cost.

I claim:

1. An electrical circuit comprising at least two power transistors connected in series between a supply voltage terminal and a load terminal, control means connected to the respective bases of said transistors for applying control signals thereto, a pair of dynamic balancing capacitors connected in series across said transistors with a common junction of said capacitors being connected to the collector-to-emitter junction of said transistors through a balancing circuit in which a current flows during change of state of said transistors, said balancing circuit including current sensitive means coupled to said control means for generating balancing signals in response to said current flowing in said balancing circuit, said balancing signals acting on said control means to increase the base current of one of said transistors and reduce the base current of the other of said transistors according to the magnitude and direction of said current flowing in said balancing circuit in order to nullify said current flowing in said balancing circuit, thereby balancing the collector-to-emitter voltages of said transistors.

2. A circuit according to claim 1, wherein said current sensitive means comprises a pair of windings connected in series, each winding being inductively coupled to a corresponding control device of said control means, each control device being connected to control the base current to the base of a corresponding one of said transistors.

3. A circuit according to claim 2, wherein said control means includes a control signal generator, wherein each of said control devices includes a transformer having a primary winding connected to said control signal generator and a secondary winding connected between the base and the emitter of a corresponding one of said transistors, whereby said transistors are isolated from said control signal generator, and wherein each of said pair of windings in inductively coupled to the secondary winding of the transformer of the corresponding control device.

4. An electrical circuit comprising two power transistors connected in series between a supply voltage terminal and a load terminal, control means connected to the respective bases of said transistors for applying control signals thereto, and balancing circuit means for balancing the collector-to-emitter voltages of said transistors, said balancing circuit means including a pair of dynamic balancing capacitors connected across said transistors and having a common junction connected to a junction between the collector of one of said transistors and the emitter of the other of said transistors and current responsive means coupled to the bases of said transistors and to said common junction of said capacitors for generating balancing signals in response to a current flow in said common junction of said capacitors during change of state of said transistors and for applying respective balancing signals to the bases of said transistors to adjust the respective base currents of said transistors in order to balance the collector-to-emitter voltages of said transistors.

5. A circuit according to claim 4, wherein said current responsive means comprises a pair of inductors connected in series between said junction of the collector of said one transistor and the emitter of said other transistor and said common junction of said capacitors.

6. A circuit according to claim 5, wherein said inductors are inductively coupled to said control means.

7. A circuit according to claim 6, wherein said control means includes transformer means having a pair of secondary windings, each of said secondary windings being connected between the base and the emitter of a corresponding one of said transistors, and wherein each of said inductors is inductively coupled to a corresponding one of said secondary windings.

* * * * *